US010645766B2

(12) United States Patent
Burleigh et al.

(10) Patent No.: US 10,645,766 B2
(45) Date of Patent: May 5, 2020

(54) HIGH FREQUENCY ENERGY GENERATOR SYSTEMS

(71) Applicant: TELEDYNE E2V (UK) LIMITED, Chelmsford, Essex (GB)

(72) Inventors: Paul Simon Burleigh, Rayleigh (GB); Stephen Mark Iskander, Chelmsford (GB)

(73) Assignee: TELEDYNE UK LIMITED, Thousand Oaks, CA (US)

( * ) Notice: Subject to any disclaimer, the term of this patent is extended or adjusted under 35 U.S.C. 154(b) by 90 days.

(21) Appl. No.: 14/417,516

(22) PCT Filed: Jul. 29, 2013

(86) PCT No.: PCT/GB2013/052026
§ 371 (c)(1),
(2) Date: Jan. 26, 2015

(87) PCT Pub. No.: WO2014/016623
PCT Pub. Date: Jan. 30, 2014

(65) Prior Publication Data

US 2015/0257209 A1 Sep. 10, 2015

(30) Foreign Application Priority Data

Jul. 27, 2012 (GB) .................................. 1213402.9

(51) Int. Cl.
*H05B 6/66* (2006.01)
*H05B 6/68* (2006.01)
(Continued)

(52) U.S. Cl.
CPC ............... *H05B 6/664* (2013.01); *H05B 6/66* (2013.01); *H05B 6/78* (2013.01); *H05B 6/80* (2013.01);
(Continued)

(58) Field of Classification Search
CPC . H05B 6/66; H05B 6/78; H05B 6/664; H05B 6/80; H05B 2206/044; H05B 2206/046
(Continued)

(56) References Cited

U.S. PATENT DOCUMENTS 3,601,448 A 8/1971 Stone
4,256,944 A 3/1981 Brandon
(Continued)

FOREIGN PATENT DOCUMENTS

EP 2487990 A1 8/2012
GB 1305146 A 1/1973
(Continued)

OTHER PUBLICATIONS

GB Search Report of Application No. GB 1213402.9 dated Jun. 19, 2013.

(Continued)

*Primary Examiner* — Quang T Van
(74) *Attorney, Agent, or Firm* — FisherBroyles, LLP; Robert Kinberg

(57) ABSTRACT

A high frequency energy generator system includes a plurality of high frequency energy generator heads. Each head includes a respective magnetron; a common drive unit for producing power for the plurality of magnetrons; and a connector arrangement connecting each of the plurality of heads to the common drive unit to supply power to the magnetrons. At least one of the heads is located remote from the common drive unit.

22 Claims, 6 Drawing Sheets

(51) Int. Cl.

*B29C 35/08* (2006.01)
*H05B 6/80* (2006.01)
*H05B 6/78* (2006.01)

(52) U.S. Cl.

CPC .. *H05B 2206/044* (2013.01); *H05B 2206/046* (2013.01)

(58) Field of Classification Search

USPC ....... 219/761, 679, 695, 686, 700, 701, 704, 219/748, 762, 737, 738, 760; 204/157.6; 422/21, 22, 186, 285, 286; 425/174.4

See application file for complete search history.

(56) References Cited

U.S. PATENT DOCUMENTS

| | | | |
|---|---|---|---|
| 4,904,835 A | 2/1990 | Koch et al. | |
| 5,227,598 A | 7/1993 | Woodmansee et al. | |
| 5,481,092 A | 1/1996 | Westmeyer | |
| 5,575,106 A | 11/1996 | Martin et al. | |
| 5,980,962 A * | 11/1999 | Bracken ............. | A23C 19/0912 219/411 |
| 2003/0224082 A1* | 12/2003 | Akopyan ............ | B29C 33/3828 425/174.4 |
| 2007/0102279 A1 | 5/2007 | Novak | |
| 2009/0173667 A1 | 7/2009 | Varma | |
| 2012/0061384 A1 | 3/2012 | Kasai et al. | |
| 2013/0075390 A1* | 3/2013 | Ashida .............. | H01J 37/32266 219/702 |

FOREIGN PATENT DOCUMENTS

| | | | |
|---|---|---|---|
| GB | 2420542 | A | 5/2006 |
| JP | H05343178 | A | 12/1993 |
| JP | H09049635 | A | 8/1995 |
| JP | H113775 | A | 1/1999 |
| JP | 2003187957 | A | 7/2003 |
| WO | WO-88/00425 | A1 | 1/1988 |
| WO | WO-2008149133 | A2 | 12/2008 |

OTHER PUBLICATIONS

GB Search Report of Application No. GB1313493.7 dated Jan. 29, 2014.

International Search Report of PCT/GB2013/052026 dated Aug. 20, 2014.

Written Opinion of the ISA of PCTGB2013/052026 dated Jan. 7, 2014.

International Preliminary Report on Patentability in corresponding International Application No. PCT/GB2013/052026, issuance of report on Jan. 27, 2015, 13 pages.

International Search Report in corresponding International Application No. PCT/GB2013/052026, dated Sep. 4, 2014, 6 pages.

* cited by examiner

HIGH FREQUENCY ENERGY GENERATOR SYSTEMS

This application is a National Stage of PCT/GB2013/052026, filed on Jul. 29,2013, which claims priority to GB 1213402.9, filed Jul. 27, 2012.

FIELD OF THE INVENTION

This invention relates to high frequency energy generator systems.

BACKGROUND

Microwaves may be used in industrial processing applications for heating or drying applications or to modify materials under treatment in some other way. In one application of microwave processing, for example, microwaves are used to exfoliate vermiculite by interacting with water found between layers of the material to cause expansion of the material.

Magnetrons are microwave generators suitable for industrial processing purposes. In one type of processing system, a conveyor carries material along a line and several processing stages take place at different locations. Magnetrons may be set up at appropriate places in a processing line so that they are close to where the microwave processing is required. However, this may not always be convenient or feasible because of the spatial requirements for each magnetron and its ancillary components. One solution is to locate magnetrons remotely from the line and construct waveguides to deliver the output of a magnetron to where it is required.

BRIEF SUMMARY

According to a first aspect of the invention, a high frequency energy generator system comprises: a plurality of high frequency energy generator heads, each head including a respective magnetron; a common drive unit for producing power for the plurality of magnetrons; and a connector arrangement simultaneously connecting each of the plurality of heads to the common drive unit for supplying power to the magnetrons, at least one of the heads being located remote from the common drive unit.

Power supplied to the generator system, for example, from a grid supply or a power generator, is conditioned by the common drive unit to make it suitable for driving the magnetrons. As each of the plurality of heads is simultaneously connected to the common drive unit, it enables all of the magnetrons to be operated simultaneously if required. In one embodiment, the magnetrons are operable independently of one another, such that all or some may be adjusted to change output power without affecting the operational states of others.

Use of a common drive unit to supply power for a plurality of magnetrons may enable ancillary components to be combined at the common drive unit, for example, such that several magnetrons may be supplied by fewer components than would be required for separately provisioned magnetrons. Alternatively, or in addition, the same number of components may be used but more efficiently provided by being co-located at the common drive unit. Furthermore, the high frequency energy generator head including the magnetron may be more compact compared to previous configurations which deployed stand alone magnetrons each having its own power supply and other ancillary components. Thus the spatial requirements for the magnetrons may be reduced, such that, for industrial processing use, for example, it can allow greater flexibility in positioning closer to where microwaves are required, reducing or eliminating the need for long and/or complex waveguide structures. Also, the connector arrangement may be relatively flexible, for example, comprising co-axial cabling, and thus may be readily re-positioned if a head is to be moved, which can be more difficult to achieve if significant waveguide structures have to be taken into account.

In one embodiment, heads having an output at 100 kW operate at several MHz but other power outputs and frequencies are possible. For example, systems are envisaged that may operate in the order of hundreds of MHz. In one embodiment, each magnetron in the generator system has the same operating frequency. In another embodiment, one or more of the magnetrons operate at respective different frequencies.

In an embodiment, each of the high frequency energy generator heads has a single magnetron, but there may be some arrangements in which one or more of the heads includes two or more magnetrons.

In one embodiment, at least a majority of the heads are located remote from the common drive unit. In another embodiment, only one head is remotely located and one or more of the other heads is co-located with the common drive unit. In one embodiment, all of the heads are located remotely from the common drive unit.

In an embodiment, the heads are positioned to supply high frequency energy to materials in an industrial processing arrangement. The industrial processing arrangement may involve a continuous process, for example, and the heads are positioned along a path followed by material processed in the continuous industrial processing arrangement. In another arrangement, the industrial processing arrangement involves batch processing. However, the system may be used in applications other than industrial processing where generation of microwaves is required, for example, but not limited to: soil remediation, agriculture, medical or military applications.

In an embodiment, at least one head is positioned at a different height than another head. A system in accordance with the invention may permit the head to be more compact and lighter in weight than previous magnetron apparatus having magnetron and ancillary components combined together. Thus it provides more options for locating the heads and gives greater flexibility in designing material processing lines, for example, in which the system is deployed.

In an embodiment, at least one head is moveable during generation of high frequency energy. It would be possible to scan a fixed target. The relative positions of the head and body do not need to be at fixed angles so heads can easily be mounted in any orientation. The connector arrangement may be, for example, sufficiently flexible to permit movement or some other mechanism may be used.

The connector arrangement may in one embodiment comprise respective different connectors for at least some of the heads. Thus, in one system, each head is connected via a dedicated connector, such as a coaxial cable, to the common drive unit. In another system, some or all of the heads are connected via a connector arrangement having a common portion and a divided portion having a plurality of sections, the sections connecting to respective different heads.

The connector arrangement comprises means to deliver power and may also include means to deliver at least one of:

cooling fluid; magnetron control signalling; magnetron heater supply; safety control signalling; and electromagnet power supply. The connector arrangement may include lines for different deliverables bundled together. In another embodiment, some or all of them are combined into a single sheath, for example, providing ease of handling when deploying the system.

In one embodiment, each head includes a magnetron, an input adapted to receive power from the common drive unit, and output for high frequency energy generated by the magnetron and at least one of: an electromagnet; a control and monitoring module; a low voltage power supply; and local cooling apparatus. Each head in a system may be nominally identical, but in another system, one head may have a different internal layout or include different components to another. For example, one head may have individually provided coolant whereas other heads are arranged to receive coolant via a common route.

In one embodiment, the common drive unit includes: power supply means having a plurality of outputs, the outputs being connected to inputs of step-up transformer means and outputs of the step-up transformer means being connected to the connector arrangement.

The power supply means may comprise an input drive module connected via a common DC link to a plurality of output drive modules, and outputs of the output drive modules being said plurality of outputs of the step-up transformer means. However, other arrangements are possible. For example, in another embodiment, an active front end is included instead of the input drive module.

In one embodiment, at least one of the output drive modules is connected to inputs of a plurality of step-up transformers.

In one embodiment, the common drive unit includes: first switched mode power supply (SMPS) means, and a plurality of second SMPS means connected in series to the first SMPS means by DC bus means with capacitor means connected between outputs of the first SMPS means and between inputs of respective second SMPS means, the outputs of the plurality of second SMPS means being connected to inputs of respective step-up transformer means, wherein the plurality of second SMPS means is arranged to feed respective step-up transformer means and to operate with a variable duty cycle and/or variable frequency to provide average power control for application to respective magnetrons.

In one embodiment, the common drive unit includes power supply means, a plurality of step-up transformers and at least one of: magnetron heater supply means; common cooling apparatus for supplying coolant to the plurality of heads; and a control module for controlling operation of the magnetrons.

In one embodiment, means are included for independently controlling operation of the magnetrons. For example, where six heads are included, each having one magnetron, the magnetrons may be operated as pairs. Also, individual magnetrons may be isolated from the system for maintenance or because they are not required for a time period.

Components of the common drive unit may be co-located and, in one embodiment, are contained within a common housing although this is not essential. In another embodiment, some of the components of the common drive unit are positioned at a first location and other components of the common drive unit are positioned at a second location, the second location being between the first location and one or more of the plurality of heads. In an embodiment, the components of the common drive unit may be housed in first and second housings located at the first and second locations respectively. In one embodiment, the power supply means may comprise an input drive module connected via a common DC link to a plurality of output drive modules, and the input drive module is housed in a first housing and the plurality of output drive modules in a second housing, with the common DC link extensive between the first and second housings. In another embodiment, an active front end is used instead of the input drive module.

According to a second aspect of the invention, a high frequency delivery head comprises: a magnetron; an input adapted for receiving power for the magnetron via a connector from a common drive unit for producing power for a plurality of magnetrons; an output for high frequency energy generated by the magnetron and at least one of: an electromagnet; a control and motoring module; a low voltage power supply; and local cooling apparatus.

BRIEF DESCRIPTION OF THE DRAWINGS

Some embodiments of the present invention will now be described by of example only, and with reference to the accompanying drawings, in which.

DETAILED DESCRIPTION

Figure 1:
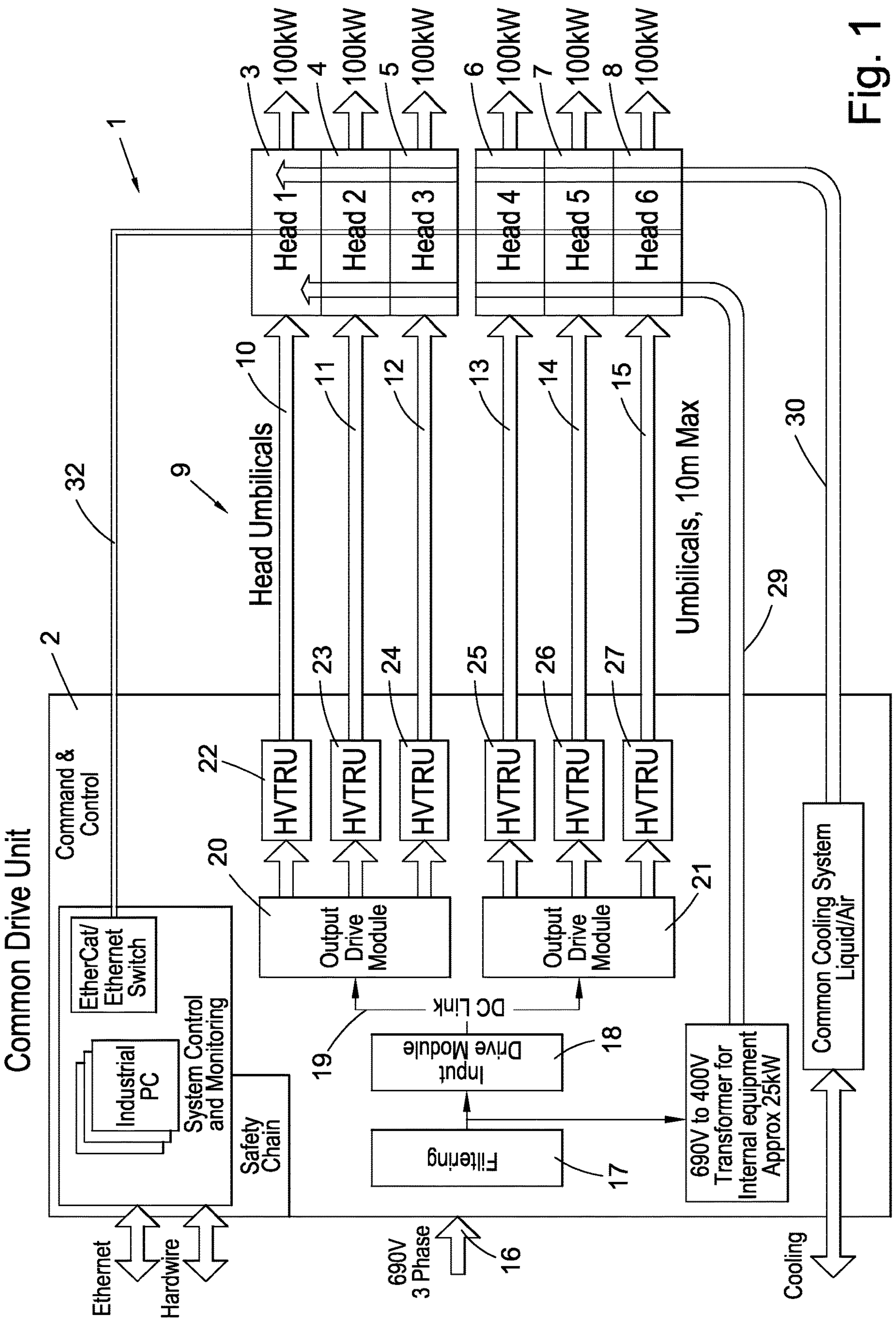
FIG. 1 schematically illustrates a system in accordance with the invention.

With reference to FIG. 1, a high frequency energy generator system 1 deployed for use in an industrial processing line comprises a common drive unit 2, six high frequency energy generator heads 3 to 8, each head including a respective magnetron (not shown) and a connector arrangement 9 connecting each of the heads 3 to 8 to the common drive unit 2 to supply power to the magnetrons. The connector arrangement 9 has six connectors 10 to 15, each connector being dedicated to a respective head 3 to 8.

Each head 3 to 8 is located remote from the common drive unit 2 and, in this embodiment, the connectors 10 to 15 have a maximum length of 10 m and are flexible to facilitate positioning of the heads.

A three phase electrical signal of 690V is applied to an input 16 of the common drive unit 2. The input is filtered at 17 to suppress harmonics and then applied to an input drive module 18 which has three single channels. The output of the primary drive module 18 is applied via a dc link 19 to two output drive modules 20 and 21, providing an input to them at 1000V. The output drive modules 20 and 21 have three phase switched outputs which are applied to high voltage step-up transformer units 22 to 27. At each transformer unit 22 to 27, the input is amplified resulting in a switched high voltage output of 20 kV. This is supplied to the heads 3 to 8 to power the magnetrons so that each head delivers an output at 100 kW, giving 600 kW in total for this system.

The output of the filter 17 is also applied to a 690V to 400V transformer 28, also included in the common drive unit 2, to obtain a supply for internal equipment included in the heads 3 to 8 such as a heater supply and electromagnet supply. The output of this transformer 28 is supplied to the heads 3 to 8 via a separate route 29 from the connector arrangement 9 in this embodiment, the output power of the transformer 28 being approximately 25 kW.

Cooling is required at the heads 3 to 8 and this is applied via a common cooling system 30, which may use air or liquid as the coolant as appropriate. Parts of the cooling system are included in the common drive unit 2 and may also provide cooling thereto.

The common drive unit 2 also houses a system control and monitoring sub-system 31 which controls operation of the magnetrons via a control line 32. The control of the magnetrons may be dependent or independent on the process for which the microwaves are required, or different modes may be used at different times. Also, the control system may be used to switch down individual magnetrons for routine or emergency maintenance, for example. This may be particularly important when it would be financially and technically undesirable to close an entire process line down. Safety controls are also handled in sub-system 31, receiving inputs from the heads 3 to 8 indicating status such as arcing or leakage of high frequency radiation.

Although the system of FIG. 1 is shown having six heads, this is not essential and other systems having a greater or lesser number of heads may be implemented. In another embodiment, an active front end is included instead of the input drive module of FIG. 1.

Figure 2:
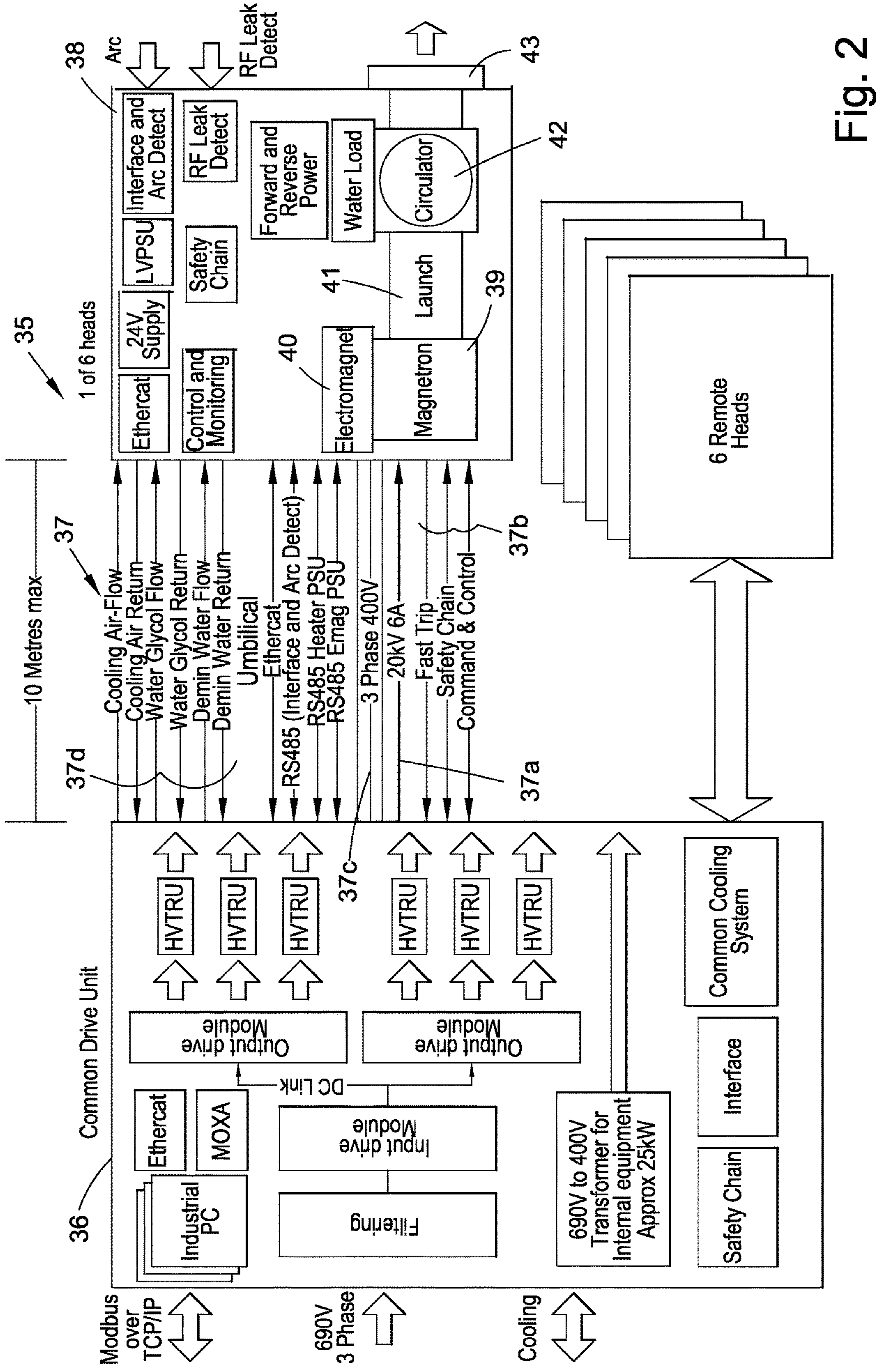
FIG. 2 schematically illustrates another system in accordance with the invention.

With reference to FIG. 2, in another high frequency energy generator system 35, a common drive unit 36 has a similar layout as that shown in FIG. 1 and again six heads are included by way of example. In this system 35, the connector arrangement 36 includes an umbilical 37 for one of the heads 38, with each of the other heads having a respective different and similar umbilical (not separately shown). The umbilical 37 includes a conductor 37*a* to supply operating power for magnetron at 20 kV, safety and control lines 37*b*, a 3 phase 400V line 37*c* for components within head 38 such as the heater supply and electromagnet supply, and a coolant line 37*d*. The coolant line 37*d* may include several conduits for different types and directions of coolant flow. In some systems, only one type of cooling at a head is required, but in others a mixed cooling solution is preferred.

The high frequency energy generator heads in this embodiment are nominally identical. Some components included in the head 38 are schematically shown and include a magnetron 39, electromagnet 40 and launch waveguide 41 for receiving the output of the magnetron 40 and applying it via a circulator 42 to an output port 43.

Components of the system of FIG. 1 may be similar to those shown in FIG. 2, for example, heads 3 to 8 may be similar to that shown at 38 in FIG. 2.

Figure 3:
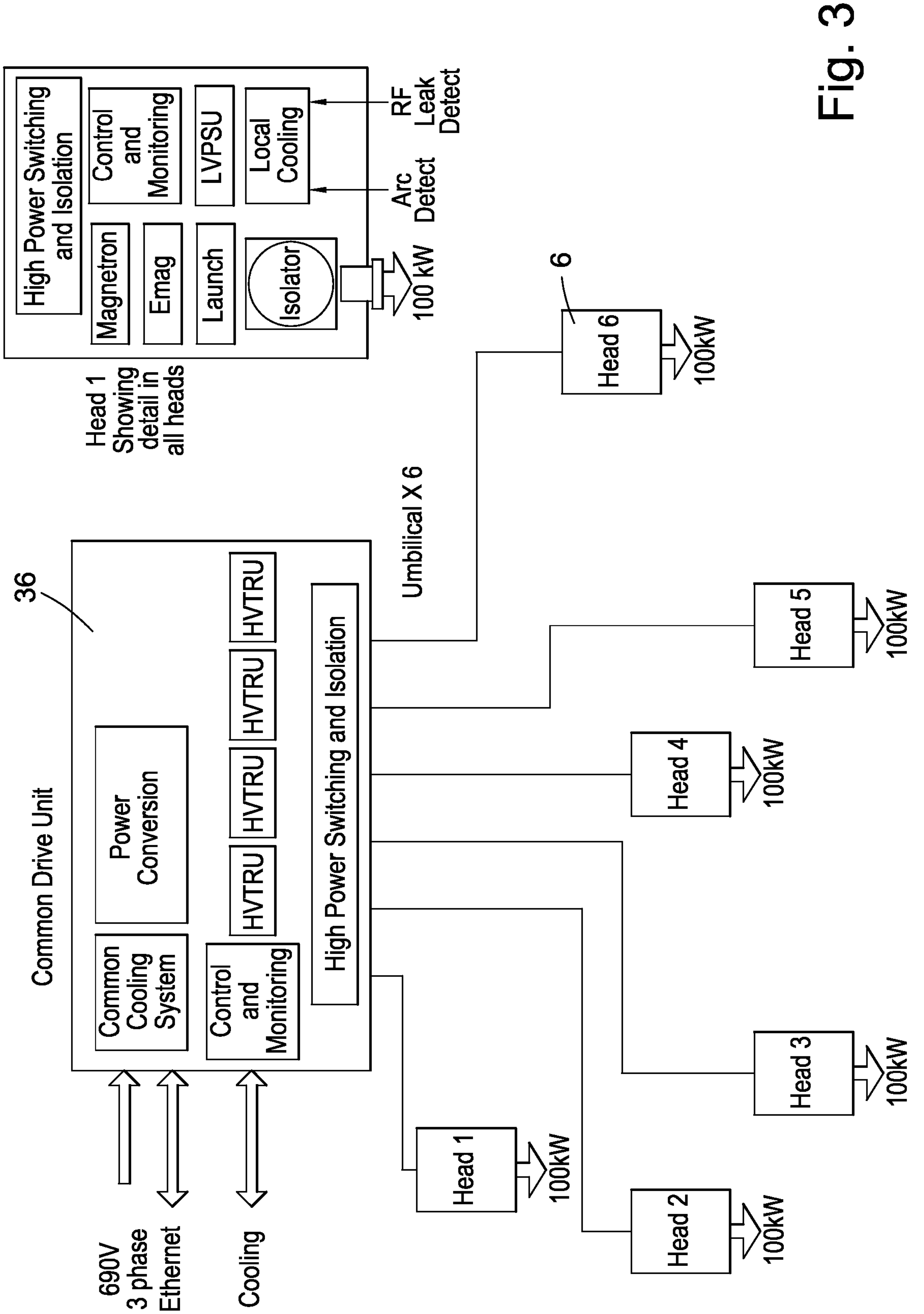
FIG. 3 schematically illustrates one arrangement of the system of FIG. 2.

With reference to FIG. 3, the system of FIG. 2 is shown deployed in an industrial processing line and is arranged such that the heads are located remote from the common drive unit 36 and at different places relative to the line. The flexible umbilical connectors enable heads to be located relatively easily. One of the heads, head 6, is positioned higher than the others.

Figure 4:
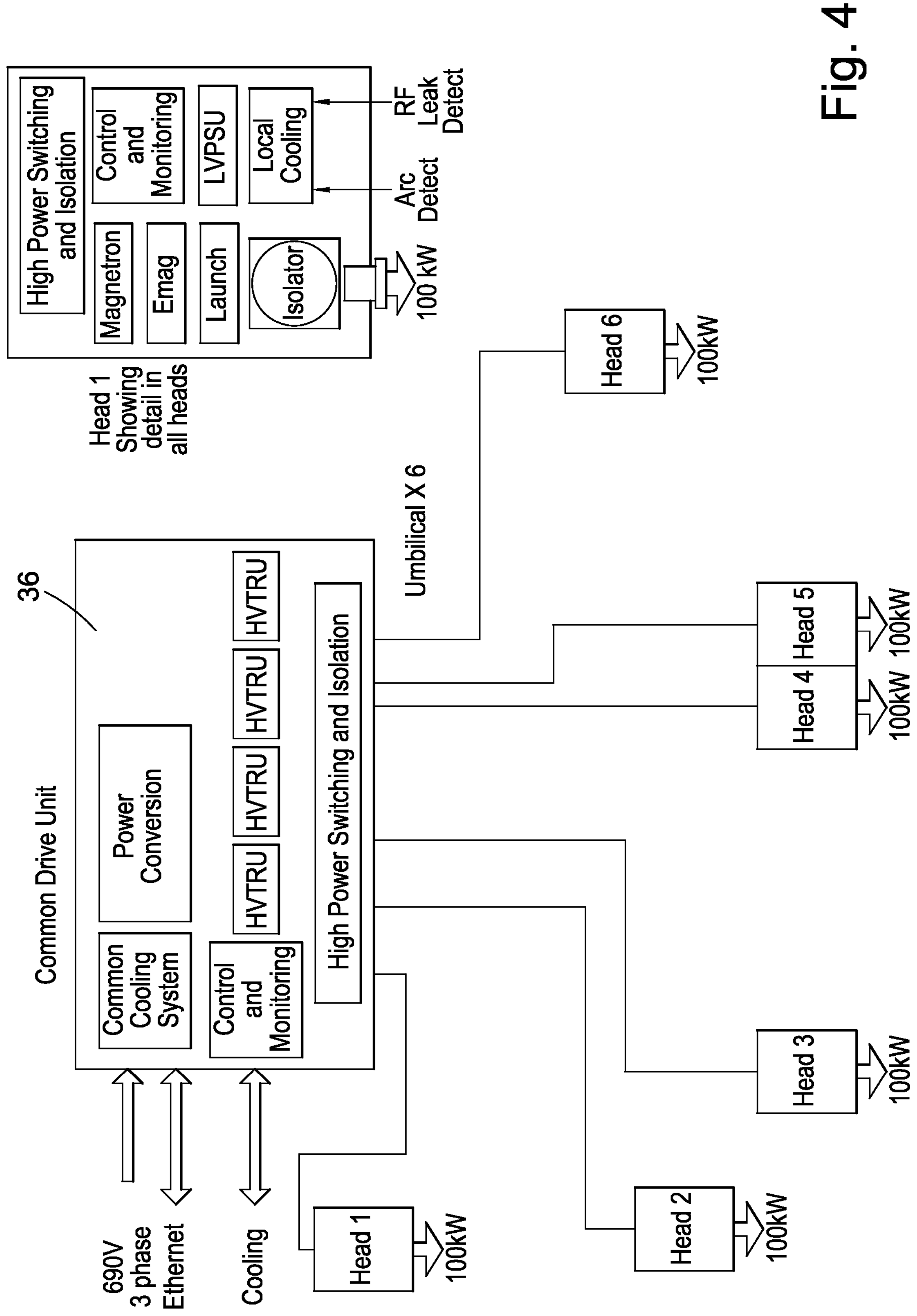
FIG. 4 schematically illustrates another arrangement of the system of FIG. 2.

With reference to FIG. 4, the system of FIG. 2 is shown deployed in another arrangement. In this arrangement, two of the heads are located immediately adjacent one another and may, in some arrangements, be contained within a separate housing. One of the heads is located immediately adjacent the common drive unit such that it is not remotely located.

The high frequency energy generator heads in the FIG. 2 are nominally identical but in other systems, the heads are non-identical.

The common drive unit may be implemented in a number of different ways. One approach is as described in our patent application WO 2008/149133. Switched mode power supplies (SMPS) linked in series by a DC bus are used. The primary SMPS connects to a prime power input and maintains a high power factor with low harmonic content while setting the magnetron operating voltage and peak current levels. The secondary SMPSs feed step up transformers, single or 3-phase, and operate with a variable duty cycle and/or variable frequency to provide average power control. Rectified output is fed directly to the magnetrons without filtering.

Figure 5:
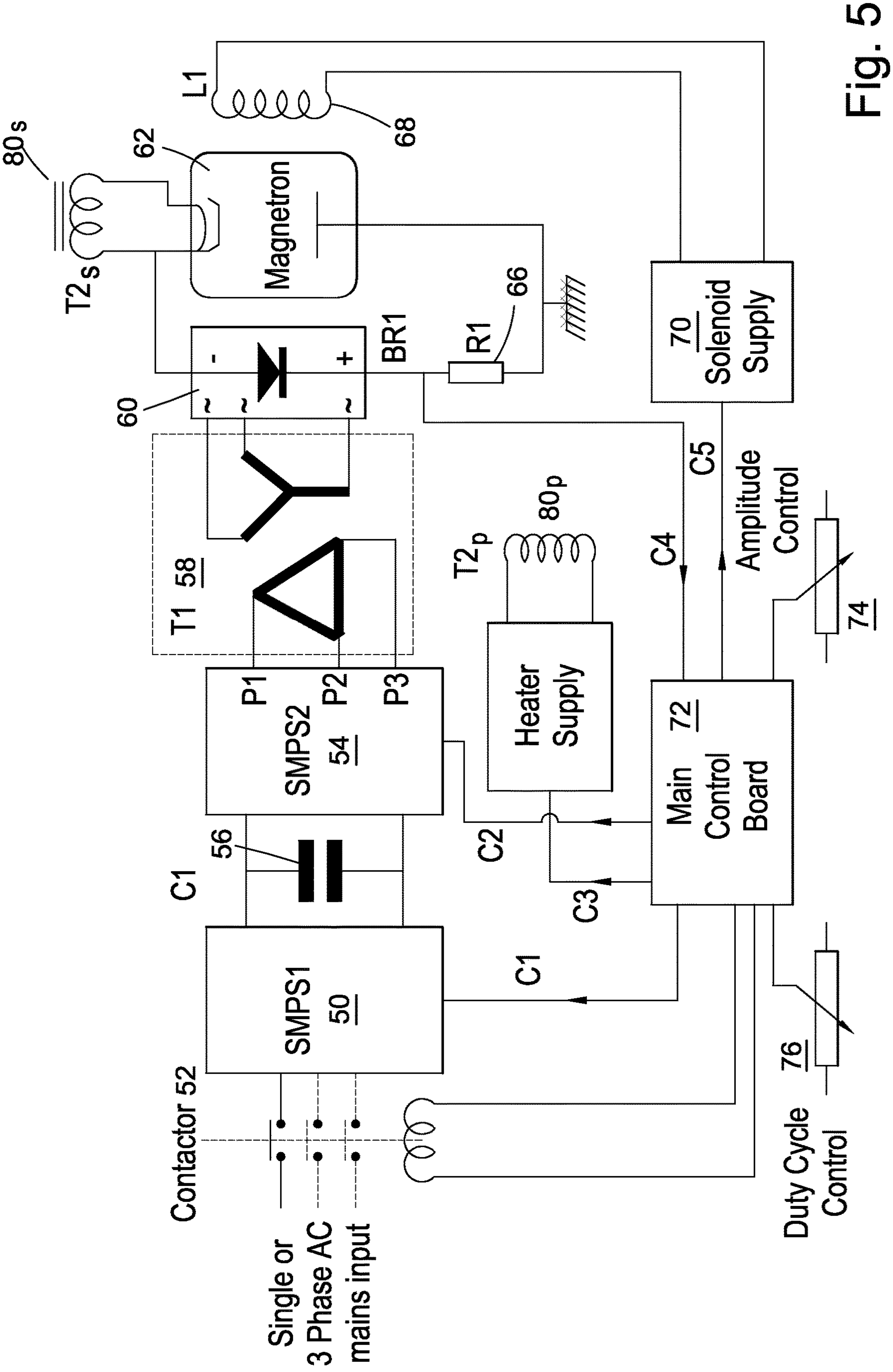
FIG. 5 schematically illustrates the common drive unit of FIG. 1 in greater detail.

With reference to FIG. 5, this is a circuit diagram of a power supply to provide a required average power in the form of high peak power, low duty cycle pulses. A first switched mode power supply (SMPS 1) 50 corresponding to the primary drive module 18 of FIG. 1 interfaces with a mains prime power via a contactor 52. A DC output from the first switched mode power supply 50 is input to a second switched mode power supply (SMPS2) 54 corresponding to the secondary drive module 20 of FIG. 1. The circuitry and components described below with reference to SMPS2 54 are duplicated for the other of the secondary drive modules 21 of FIG. 1.

A C1 capacitor 56 is connected across the DC output of SMPS 1 50 and the DC input of SMPS2 54.

The second switched mode power supply (SMPS2) 54 has three outputs P1, P2 and P3 and operates as a DC to 3-Phase AC converter with an output to a Ti transformer 58, corresponding to one of the transformers 22 to 27 of FIG. 1. Ti transformer 58 has an output to a BR1 rectifier 60 such that a voltage transformation by Ti transformer 38 and BR1 rectifier 60 matches a required voltage of a magnetron 62 at an optimum operating current. A voltage of the DC output of the first switched mode power supply 50 is controlled by a main control board 72 to give this required voltage at the magnetron 62. Note that in this schematic circuit diagram the connector arrangement, such as illustrated in FIG. 1 for example, is not shown but this is included between the output of the Ti transformer 58 and the rectifier 60.

A current through the magnetron 62 is monitored by an R1 resistor 66 between a positive voltage output of the rectifier 60 and an anode of the magnetron 62. An operating voltage of the magnetron 62 can be set to a predetermined value by setting a current through a solenoid 68 which is controlled by a solenoid supply 70 to set a magnetic field which is applied to the magnetron 62. Over a usual range of operation the magnetron voltage is virtually directly proportional to the solenoid current.

A main control board 72 has a signal input from the R1 resistor 66 via a control line c4 and an output for a control signal for SMPS1 50 on a control line cl and for the solenoid supply 70 on a control line c5. All these functions can be controlled by an amplitude control module 74 with an input to the main control board 72, that permits the required magnetron voltage and current to be set with a single control, so that the magnetron peak voltage and current and thus the RF power peak value is set thereby for the system.

SMPS2 54 is designed to produce a transformer-compatible 3-phase nominally rectangular pulse drive waveform that can be used to vary the average magnetron current by pulse width modulation techniques.

Magnetron anode current is monitored by R1 resistor 66 and a signal is input via control line c4 to the main control board 72 and an output signal is output to SMPS2 54 via control line c2. Varying the duty cycle of the SMPS2 54 varies the pulse duty output, and thus the average power from SMPS2 54. A duty cycle control 76 input to the main control board 72 permits a required duty cycle to be set. Magnetrons, as distinct from at least some other generators of microwave power, require the heater voltage to be reduced as the average power increases. The main control board 72 also performs this function by outputting a control signal on control line c3 to control the heater supply 78 having an output to a heater T2 transformer 80 electrically coupled via the connector arrangement to the heater of the magnetron 62.

In another arrangement, a regenerative active front end AFE may be used to provide the function of the SMPS1. This allows the DC link voltage to be set, for example, as shown at amplitude control 74 on FIG. 5, and provides a mechanism for controlling any excess voltage on the DC link 19 by regeneration and feeding it back in to the three phase supply. It can also control harmonic distortion feedback onto the three phase supply to acceptable levels.

For a high-power system a typical set of values for an application are C1 voltage 800V for a magnetron operating at 20 kV at 6 A peak for 65 to 100 kW of peak RF output. The magnetron frequency is centred on 896 MHz in one example but other frequencies may be used instead, for example, to take into account different national standards. The duty cycle is 50% for 50 kW average output power. Operating frequency for SMPS1 50 and SMPS2 54 is 4,000 pps. In one system, each of the magnetrons operates at substantially the same frequency. In another system, one or more magnetrons operate at respective different frequencies.

Figure 6:
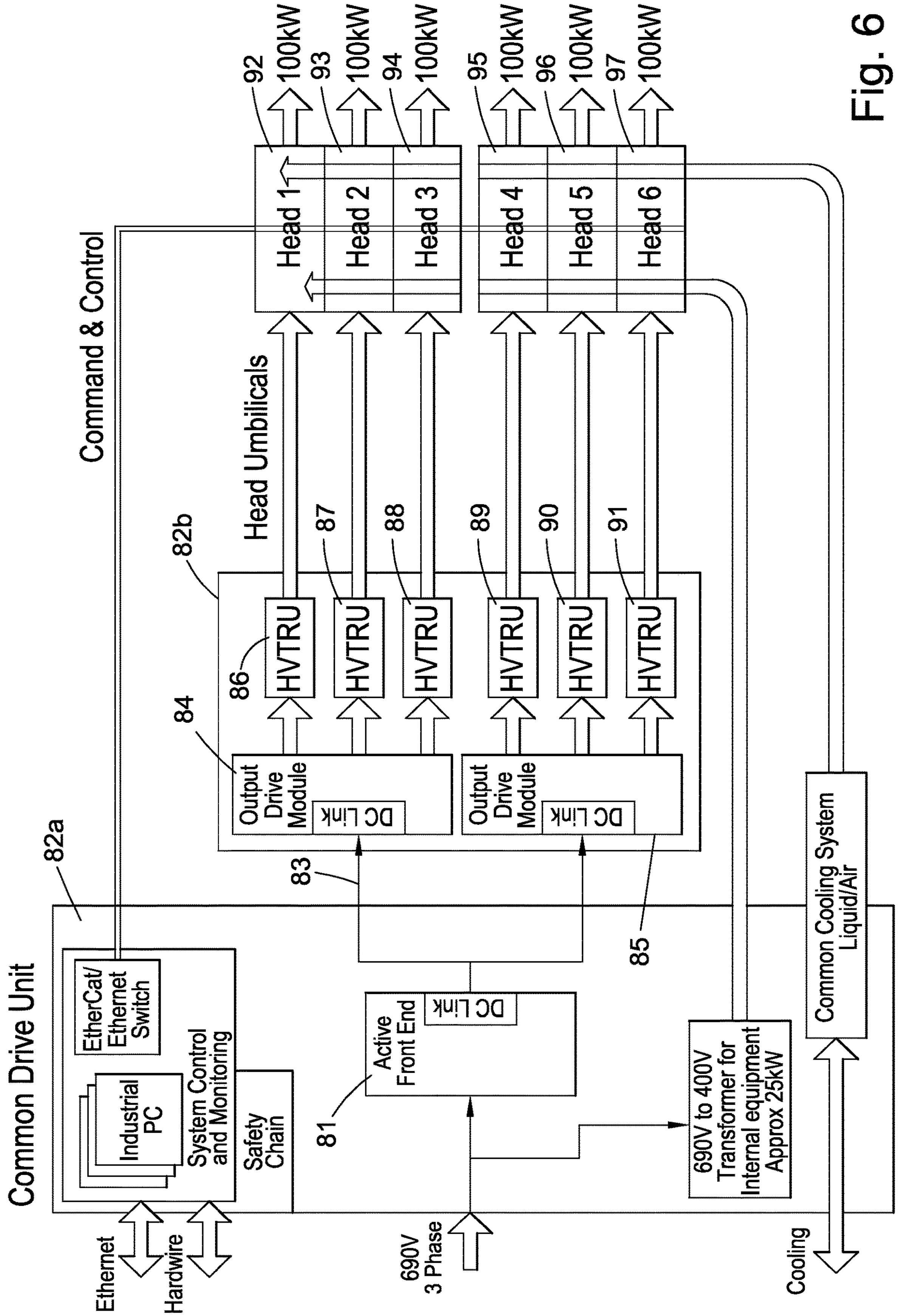
FIG. 6 schematically illustrates another system in accordance with the invention.

With reference to FIG. 6, in another system in accordance with the invention, the components are similar to those of the system as shown in FIG. 1 but configured such that parts of the common drive unit 2 are located remote from each other and an active front end 81 is included in place of the input drive module of FIG. 1. In the system of FIG. 6, the common DC link 83 is extended and the output drive modules 84 and 85 and high voltage step-up transformer units 86 to 91 are positioned closer to, or at, the heads 92 to 97. Components of the common drive unit 2 are contained in first and second housings 82*a* and 82*b*. The first housing 82*a* includes the active front end 81 and the second housing contains the output drive modules 84 and 85 and high voltage step-up transformer units 86 to 91. In other embodiments, the first and/or second housing may be omitted. In another embodiment, a system similar to that shown in FIG. 6 includes an input drive module instead of the active front end 81.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

The invention claimed is:

1. A high frequency energy generator system comprising: a plurality of high frequency energy generator heads, each head including a respective magnetron; a common drive unit for producing power for the plurality of magnetrons and including a plurality of step-up transformers, wherein the common drive unit is arranged to condition the power to make it suitable for simultaneously driving the plurality of magnetrons, and wherein the common drive unit comprises at least one switched mode power supply, each of said at least one switched mode power supplies being arranged to simultaneously drive the plurality of magnetrons; and a connector arrangement simultaneously connecting each of the plurality of heads to the common drive unit for supplying power to the magnetrons, at least one of the heads being located remote from the common drive unit.

2. The system as claimed in claim 1 wherein at least a majority of the heads are located remote from the common drive unit.

3. The system as claimed in claim 1 wherein the heads are positioned to supply high frequency energy to materials in an industrial processing arrangement.

4. The system as claimed in claim 3 wherein the heads are positioned along a path followed by material processed in a continuous industrial processing arrangement.

5. The system as claimed in claim 1 wherein at least one head is positioned at a different height than another head.

6. The system as claimed in claim 1 wherein at least one head is moveable during generation of high frequency energy.

7. The system as claimed in claim 1 wherein the connector arrangement comprises respective different connectors for at least some of the heads.

8. The system as claimed in claim 1 wherein the connector arrangement comprises a common portion and a divided portion having a plurality of sections, the sections connecting to respective different heads.

9. The system as claimed in claim 1 wherein the connector arrangement comprises means to deliver power and at least one of: cooling fluid; magnetron control signalling; magnetron heater supply; safety control signalling; and electromagnet power supply.

10. The system as claimed in claim 9 and wherein the connector arrangement includes lines for different deliverables bundled together.

11. The system as claimed in claim 1 wherein each head includes a magnetron, an input adapted to receive power from the common drive unit, and output for high frequency energy generated by the magnetron and at least one of: an electromagnet; a control and monitoring module; a low voltage power supply; and local cooling apparatus.

12. The system as claimed in claim 1 wherein the common drive unit includes: power supply means having a plurality of outputs, the outputs being connected to inputs of step-up transformer means and outputs of the step-up transformer means being connected to the connector arrangement.

13. The system as claimed in claim 12 wherein the power supply means comprises an input drive module connected via a common DC link to a plurality of output drive modules, and outputs of the output drive modules being said plurality of outputs of the step-up transformer means.

14. The system as claimed in claim 13 wherein at least one of the output drive modules is connected to inputs of a plurality of step-up transformers.

15. The system as claimed in claim 12 wherein the common drive unit includes: first switched mode power supply (SMPS) means, and a plurality of second SMPS means connected in series to the first SMPS means by DC bus means with capacitor means connected between outputs of the first SMPS means and between inputs of respective second SMPS means, the outputs of the plurality of second SMPS means being connected to inputs of respective step-up transformer means, wherein the plurality of second SMPS means is arranged to feed respective step-up transformer means and to operate with a variable duty cycle and/or variable frequency to provide average power control for application to respective magnetrons.

16. The system as claimed in claim 12 wherein the power supply means comprises an active front end connected via a common DC link to a plurality of output drive modules, and outputs of the output drive modules being said plurality of outputs of the step-up transformer means.

17. The system as claimed in claim 1 wherein the common drive unit includes power supply means, a plurality of step-up transformers and at least one of: magnetron heater supply means; common cooling apparatus for supplying coolant to the plurality of heads; and a control module for controlling operation of the magnetrons.

18. The system as claimed in claim 1 wherein some components of the common drive unit are positioned at a first location and other components of the common drive unit are positioned at a second location, the second location being between the first location and one or more of the plurality of heads.

19. The system as claimed in claim 18 wherein components of the common drive unit are housed in first and second housings located at the first and second locations respectively.

20. The system as claimed in claim 19 wherein the first housing houses one of an input drive module and an active front end; the second housing houses a plurality of output drive modules; and a common DC link connects components housed in the first housing with components housed in the second housing.

21. The system as claimed in claim 1 and including means for independently controlling operation of the magnetrons.

22. A high frequency delivery head adapted to be used in an arrangement as claimed in claim 1.

* * * * *